(12) United States Patent
Yen (10) Patent No.: US 12,550,313 B2
(45) Date of Patent: Feb. 10, 2026

(54) SEMICONDUCTOR MEMORY STRUCTURE AND METHOD FOR FORMING THE SAME

(71) Applicant: Winbond Electronics Corp., Taichung (TW)

(72) Inventor: Ying-Chu Yen, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 787 days.

(21) Appl. No.: 17/725,481

(22) Filed: Apr. 20, 2022

(65) Prior Publication Data

US 2023/0345703 A1 Oct. 26, 2023

(51) Int. Cl.
*H10B 12/00* (2023.01)

(52) U.S. Cl.
CPC ......... *H10B 12/312* (2023.02); *H10B 12/482* (2023.02); *H10B 12/488* (2023.02)

(58) Field of Classification Search
CPC ... H10B 12/312; H10B 12/482; H10B 12/488
See application file for complete search history.

(56) References Cited

U.S. PATENT DOCUMENTS

| | | | |
|---|---|---|---|
| 6,232,233 B1 | 5/2001 | Chaudhary | |
| 6,835,649 B2 | 12/2004 | Lee et al. | |
| 7,410,869 B2 * | 8/2008 | Leam | H10B 41/30 |
| | | | 438/257 |
| 7,476,924 B2 | 1/2009 | Park et al. | |
| 8,324,098 B2 | 12/2012 | Aklik et al. | |
| 10,529,719 B2 | 1/2020 | Wu et al. | |
| 2010/0059837 A1 | 3/2010 | Kim et al. | |
| 2019/0295946 A1 | 9/2019 | Saino | |
| 2021/0273048 A1 * | 9/2021 | Park | H01L 21/76224 |
| 2022/0223597 A1 * | 7/2022 | Gong | H10B 12/30 |
| 2022/0384449 A1 * | 12/2022 | Kim | H10B 12/315 |
| 2023/0112907 A1 * | 4/2023 | Kim | H10B 12/0335 |
| | | | 257/296 |
| 2023/0164976 A1 * | 5/2023 | Park | H10B 12/34 |
| | | | 257/30 |
| 2023/0298999 A1 * | 9/2023 | Ahn | H10B 12/09 |
| | | | 257/213 |

* cited by examiner

*Primary Examiner* — Mark W Tornow
(74) *Attorney, Agent, or Firm* — MUNCY, GEISSLER, OLDS & LOWE, P.C.

(57) ABSTRACT

A semiconductor memory structure includes an isolation structure surrounding an active region in a substrate. The structure also includes two word lines disposed in the active region. The structure also includes a bit line contact disposed between two word lines. The structure also includes a first bit line disposed over the bit line contact. The bit line contact includes polysilicon and has a concave top surface.

18 Claims, 10 Drawing Sheets

SEMICONDUCTOR MEMORY STRUCTURE AND METHOD FOR FORMING THE SAME

BACKGROUND

Technical Field

The disclosure relates to a semiconductor memory structure and more particularly to a bit line and method for forming the same.

Description of the Related Art

As the size of integrated circuits decreases, the density of Dynamic Random Access Memory (DRAM) has increased. The process of filling the seam is increasingly difficult. The seam may be formed when the bit line contact is formed, and therefore a bit line contact with high resistance may be formed.

BRIEF SUMMARY

A semiconductor memory structure includes an isolation structure surrounding an active region in a substrate. The structure also includes two word lines disposed in the active region. The structure also includes a bit line contact disposed between two word lines. The structure also includes a first bit line disposed over the bit line contact. The bit line contact comprises polysilicon and has a concave top surface.

A semiconductor memory structure includes a bit line contact disposed over an active region between two word lines. The structure also includes a first bit line, comprising a first barrier layer and a first conductive layer, disposed over the bit line contact. The structure also includes a second bit line, comprising a second barrier layer and a second conductive layer, disposed over an isolation region. The first barrier layer is thicker than the second barrier layer.

A method for forming a semiconductor memory structure includes forming an isolation structure surrounding an active region in a substrate. The method also includes forming two word lines in the active region. The method also includes forming an opening between the two word lines. The method also includes depositing a polysilicon layer having a seam in the opening. The method also includes etching the polysilicon layer to enlarge the seam. The method also includes depositing a bit line material in the seam.

A detailed description is given in the following embodiments with reference to the accompanying drawings.

BRIEF DESCRIPTION OF DRAWINGS

FIGS. 2A-2E, 2F-1, 2F-2, 2G are cross-sectional representations of various stages of forming a semiconductor memory structure in accordance with some embodiments.

FIGS. 3A-3C, 3D-1, 3D-2 are cross-sectional representations of various stages of forming a semiconductor memory structure in accordance with some embodiments.

DETAILED DESCRIPTION

Figure 1:
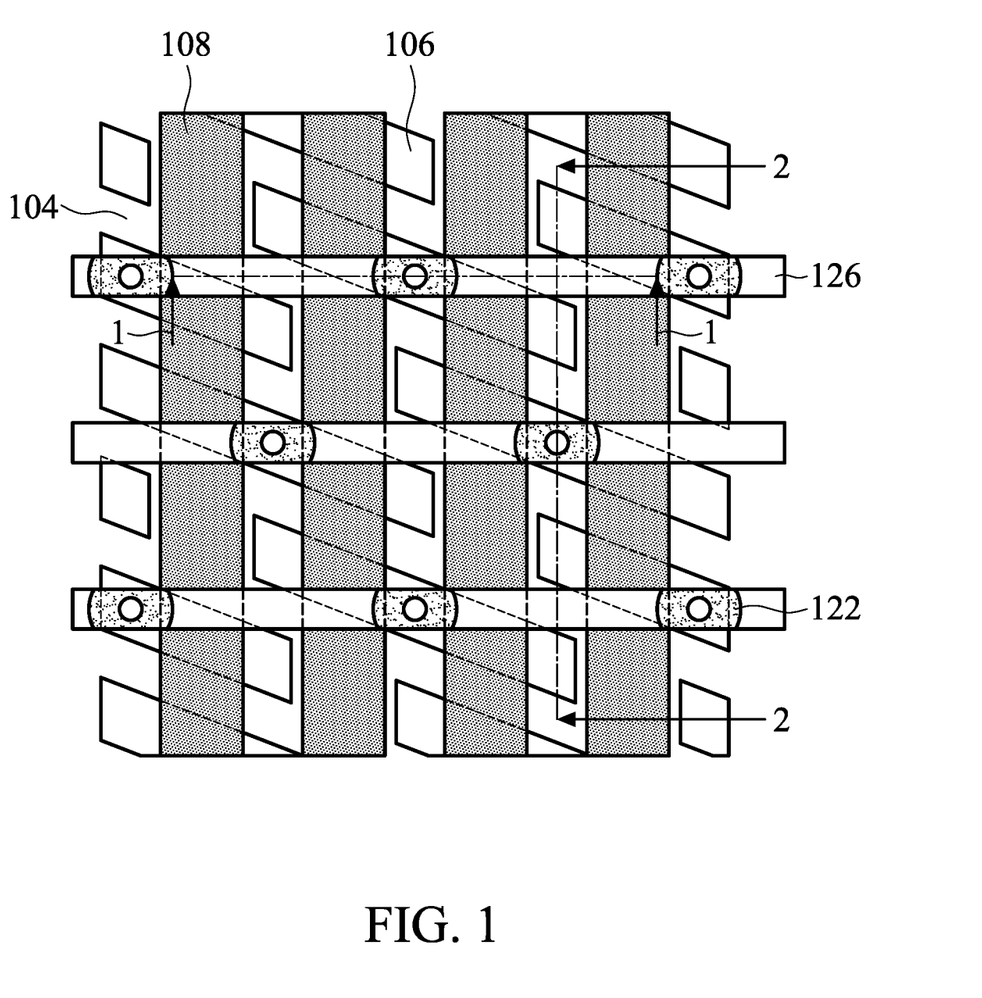
FIG. 1 is a top view of a semiconductor memory structure in accordance with some embodiments.
Figure 2A:
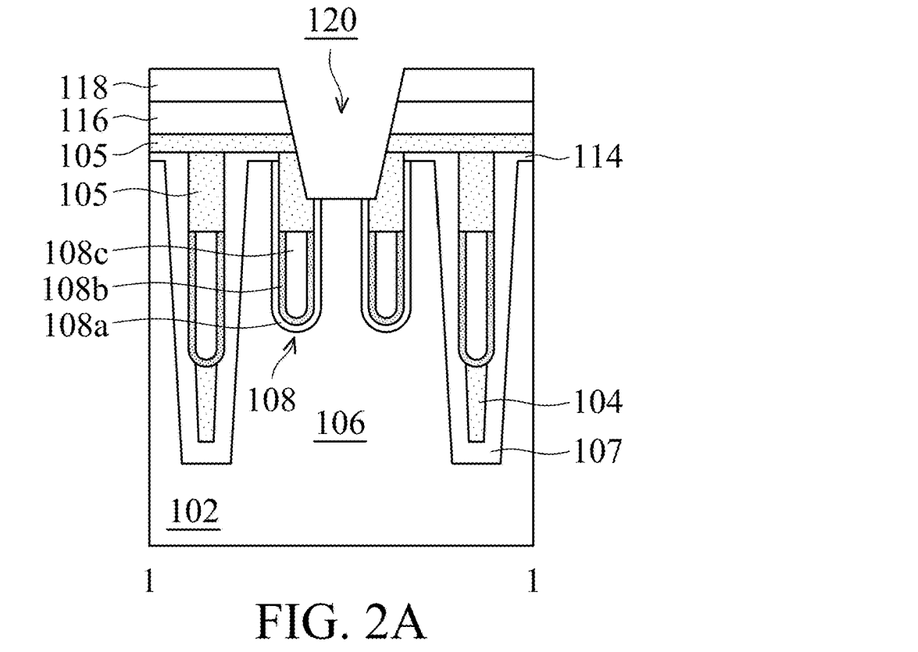
Figure 2B:
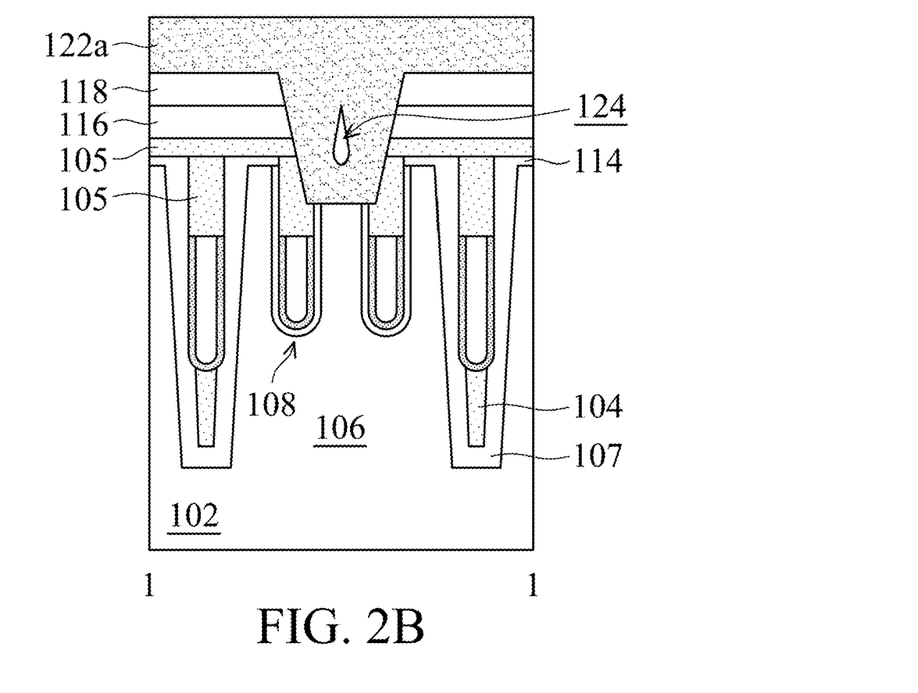

FIG. 1 is a top view of a semiconductor memory structure 100 in accordance with some embodiments. FIGS. 2A-2E, 2F-1, 2F-2, 2G are cross-sectional representations of various stages of forming a semiconductor memory structure 100 in accordance with some embodiments. FIGS. 2A-2E, 2F-1 show cross-sectional representations of semiconductor memory structure 100 taken along line 1-1 in FIG. 1. FIGS. 2F-2, 2G show cross-sectional representations of semiconductor memory structure 100 taken along line 2-2 in FIG. 1.

As shown in FIG. 1, the semiconductor memory structure 100 includes an isolation region 104 surrounding an active region 106. A bit line contact 122 is formed between two word lines 108. The bit line 126 is formed over the bit line contact 122, and is perpendicular to the word lines 108 in the top view. As shown in FIG. 2A, a substrate 102 is provided. The substrate 102 may be a semiconductor substrate, which may include elemental semiconductor or alloy semiconductor. In addition, the substrate 102 may also be a semiconductor on insulator (SOI). The substrate 102 may have an N-type or a P-type conductivity type. Next, a top layer 114 is formed over the substrate 102, and a pad layer is formed over the top layer 114 (not shown). The top layer 114 may be a buffer layer between the substrate 102 and the pad layer. The pad layer may be an isolation layer, and may be an etch stop layer for subsequently etching. The top layer 114 may be oxides such as silicon oxide. The pad layer may be SiN, SiCN, SiOC, SiOCN, other applicable materials, or a combination thereof.

Next, a trench is formed by a patterning process such as a photolithography process and an etching process to define active region 106 (not shown). In some embodiments, the trench surrounds the active region 106.

Next, a liner layer 117 is formed at the sidewalls and the bottom surface of the trench. The liner layer 117 may protect the active region 106 from being damaged in the following process (such as anneal or etching process). In some embodiments, the liner layer 117 is made of oxides such as silicon oxide.

Next, an isolation structure 104 is formed in the trench. The isolation structure 104 may be made of silicon nitride, silicon oxide, other dielectric materials, or a combination thereof. Afterwards, the isolation structure 104 is planarized to expose the top surface of the pad layer (not shown). Next, the pad layer is removed to expose the top surface of the top layer 114 (not shown). In some embodiments, the pad layer is removed by a wet etching process or a dry etching process. The wet etching process may include using $H_3PO_4$ solution.

Afterwards, a patterning process such as a photolithography and an etching process is performed to form trenches in the active region 106 and the isolation structure 104 (not shown). Since the etching rate of the etching process in the active region 106 and the isolation structure 104 are different, the trench depth in the active region 106 and the isolation structure 104 are different. In some embodiments, the trench in the isolation structure 104 is deeper than the trench in the active region 106.

Next, word lines 108 are formed in the trenches in the active region 106 and the isolation structure 104. The word lines 108 include the gate dielectric layer 108a, the barrier layer 108b, and the conductive layer 108c. The gate dielectric layer 108a is formed over the sidewalls and the bottom surface of the trench in the active region 106. The barrier layer 108b may be formed over the sidewalls and the bottom surface of the trench in the active region 106 and the trench in the isolation structure 104 to prevent diffusion of subsequently formed conductive material. Afterwards, the space between the barrier layer 108 in the trench in the active region 106 and the isolation structure 104 is filled by the conductive layer 108c.

In some embodiments, the gate dielectric layer 108 may include silicon oxide, silicon nitride, or silicon oxynitride, dielectric material with high dielectric constant (high-k) (i.e.

dielectric constant greater than 3.9) such as $HfO_2$, LaO, AlO, ZrO, TiO, $Ta_2O_5$, $Y_2O_3$, $SrTiO_3$, $BaTiO_3$, BaZrO, HfZrO, HfLaO, HfTaO, HfSiO, HfSiON, HfTiO, LaSiO, AlSiO, (Ba, Sr)$TiO_3$, $Al_2O_3$, or a combination thereof. In some embodiments, the gate dielectric layer 108a is formed by thermal oxide process such as rapid thermal processing (RTP) in-situ steam generation (ISSG) in the trench in the active region 106.

In some embodiments, the barrier layer 108 is made of metal material. The material of the barrier layer 108 may be Ti, TiN, Ta, TaN, W, WN, or a combination thereof. The conductive layer 108 includes metal material (such as tungsten, aluminum, or copper), metal alloy, or a combination thereof.

Next, an etching process is performed to etch back the conductive layer 108c and the barrier layer 108b in the active region 106 and the isolation structure 104 to a desired height.

Afterwards, the trench over the word line 108 is filled and the substrate 102 is covered by a capping layer 105. In some embodiments, the capping layer 105 and the isolation structure 104 includes nitrides such as SiN, SiCN, SiOC, SiOCN.

Next, a semiconductor material layer 116 is deposited over the capping layer 105, and a hard mask layer 118 is deposited over the semiconductor material layer 116. The semiconductor material layer 116 may include polysilicon. The hard mask layer 118 may include oxide such as silicon oxide. Afterwards, an opening 120 is formed over the active region 106 between the word lines 108 by a patterning process such as a photolithography and an etching process. In some embodiments, the opening 120 is through the hard mask layer 118, the semiconductor material layer 116, the capping layer 105, and the active region 106. Afterwards, as shown in FIG. 2B, a polysilicon layer 112a is conformally formed over the sidewalls and the bottom surface of the opening 120 and covering the top surface of the hard mask layer 118. A seam 124 is formed in the polysilicon layer 112a in the opening 120.

Figure 2C:
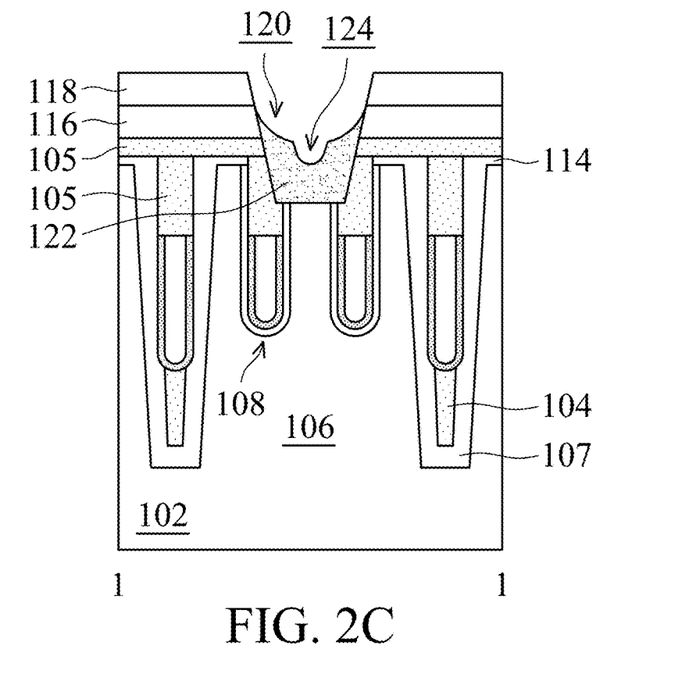

Next, as shown in FIG. 2C, the polysilicon layer 112a is etched to enlarge the seam 124. In some embodiments, the etching process removes the polysilicon layer 112a over the top surface and the sidewalls of the hard mask layer 118, and exposes the top surface and the sidewalls of the hard mask layer 118. A bit line contact 122 is formed by the polysilicon layer 112a remaining in the opening 120 over the active region 106 between the word lines 108. In some embodiments, after etching the polysilicon layer 112a, the highest point of the polysilicon layer 112a is substantially level with the top surface of the semiconductor material layer 116. In addition, after etching the polysilicon layer 112a, the polysilicon layer 112a has a curved and concave top surface. In some embodiments, the process of etching the polysilicon layer 112a may include a dry etching process (such as a reactive ion etching, anisotropic plasma etching, or a combination thereof). In some embodiments, the etching flow of the dry etching is in a range of 10 sccm to 20 sccm.

Figure 2D:
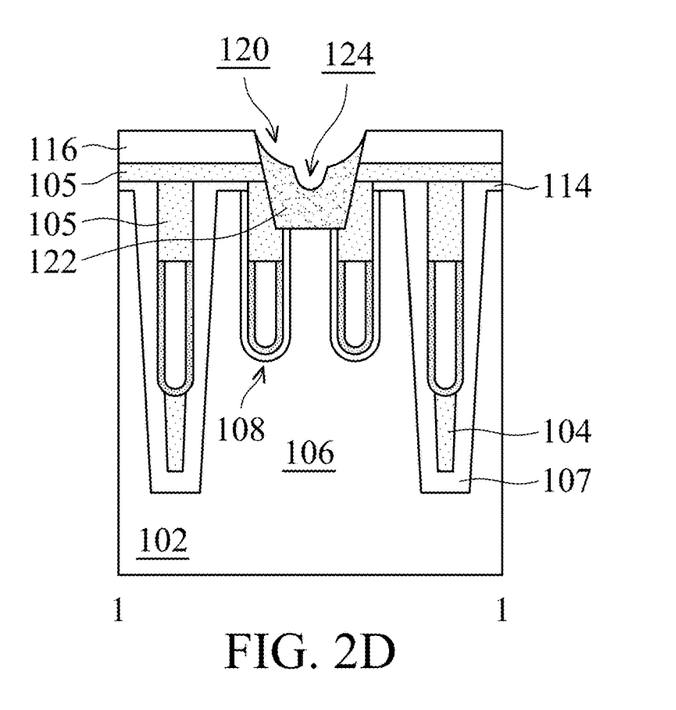

Next, as shown in FIG. 2D, the hard mask layer 118 is removed by an etching process to expose the top surface of the semiconductor material layer 116. The etching process may include a dry etching process (such as a reactive ion etching, anisotropic plasma etching), a wet etching process, or a combination thereof.

Figure 2E:
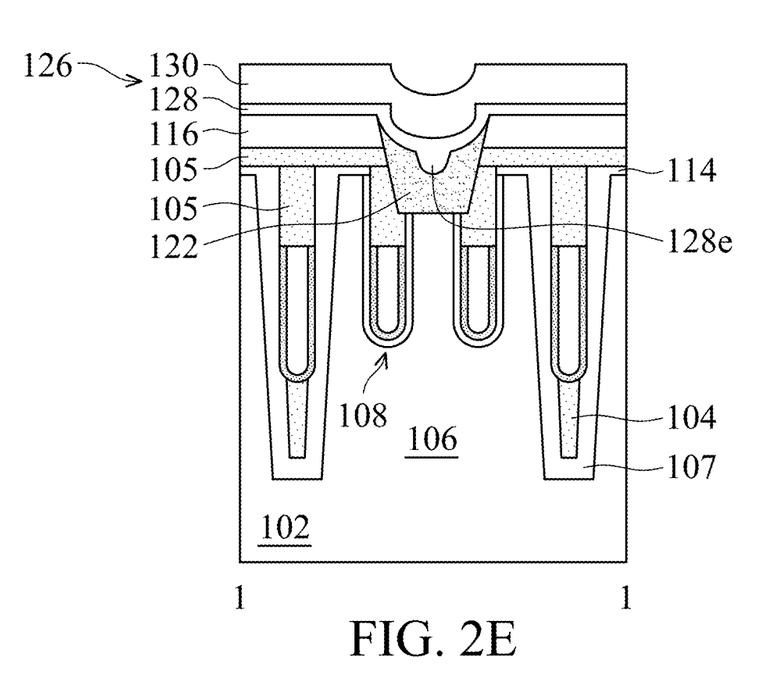

Next, as shown in FIG. 2E, a bit line material 126 is formed in the enlarged seam 124 and the opening 120 and covering over the bit line contact 122. The bit line material 126 includes the barrier layer 128 and the conductive layer 130. Before forming the conductive layer 130, a barrier layer 128 may be formed at the sidewalls and the bottom of the seam 124. The material of the barrier layer 128 may be Ti, TiN, Ta, TaN, WN, other applicable material, or a combination thereof. The conductive layer 130 includes metal material (such as tungsten, aluminum, or copper), metal alloy, or a combination thereof. According to some embodiments, the barrier layer 128 and the conductive layer 130 of the bit line material 126 may be formed by the atomic layer deposition (ALD) process.

In some embodiments, the barrier layer 128 has an extending portion 128e formed in the enlarged seam 124. In some embodiments, the extending portion 128e extends in the bit line contact 122. In some embodiments, since the seam 124 is enlarged, the top surface of the extending portion 128e of the barrier layer 128 is wider than the bottom surface of the extending portion 128e of the barrier layer 128. In addition, the extending portion 128e of the barrier layer 128 is narrower than the bit line contact 122.

In some embodiments, since the barrier layer 128 and the conductive layer 130 of the bit line material 126 are conformally formed over the bit line contact 122, the conductive layer 130 of the bit line material 126 has a concave top surface over the bit line contact 122.

Figure 2F:
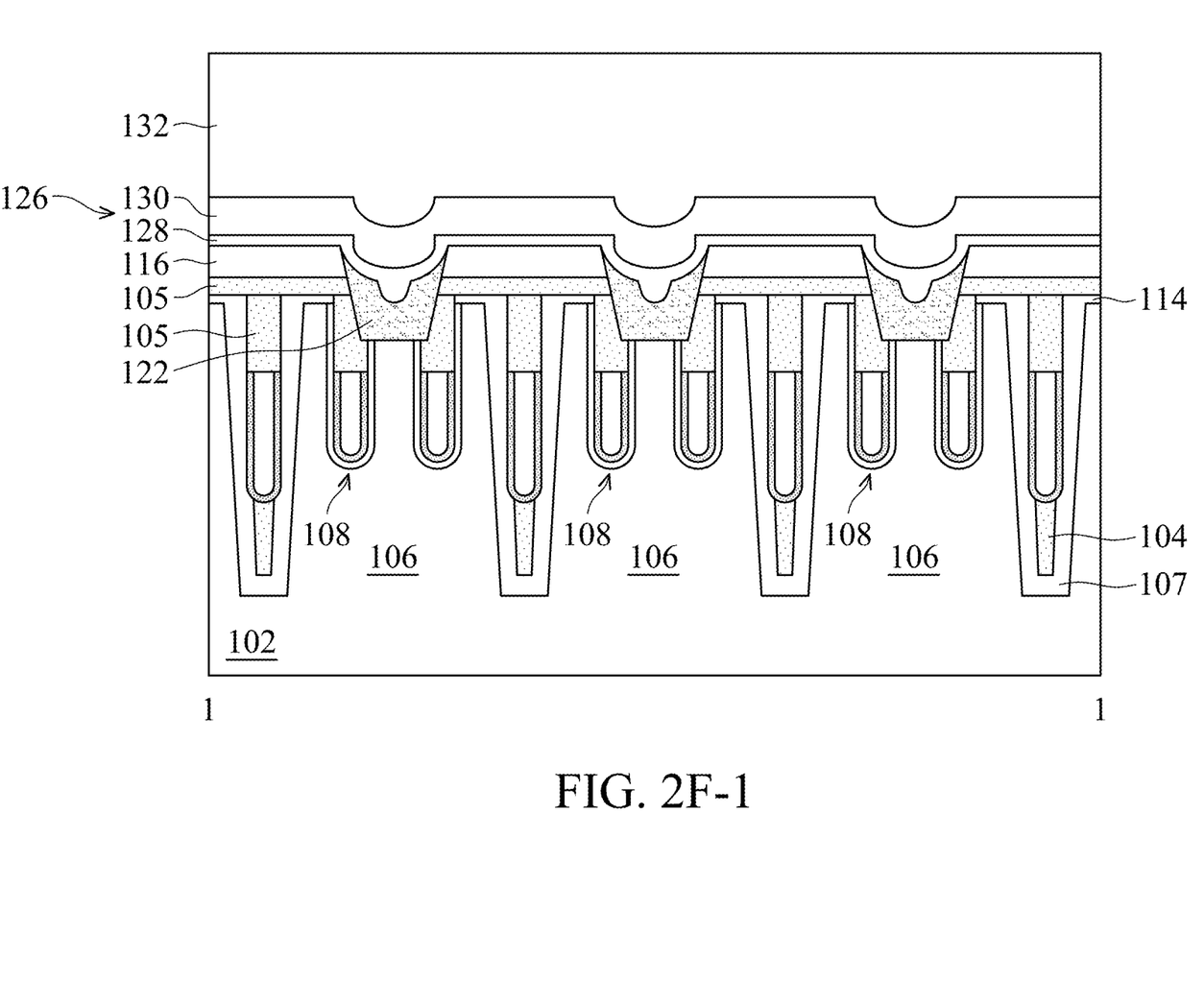
Figure 2F:
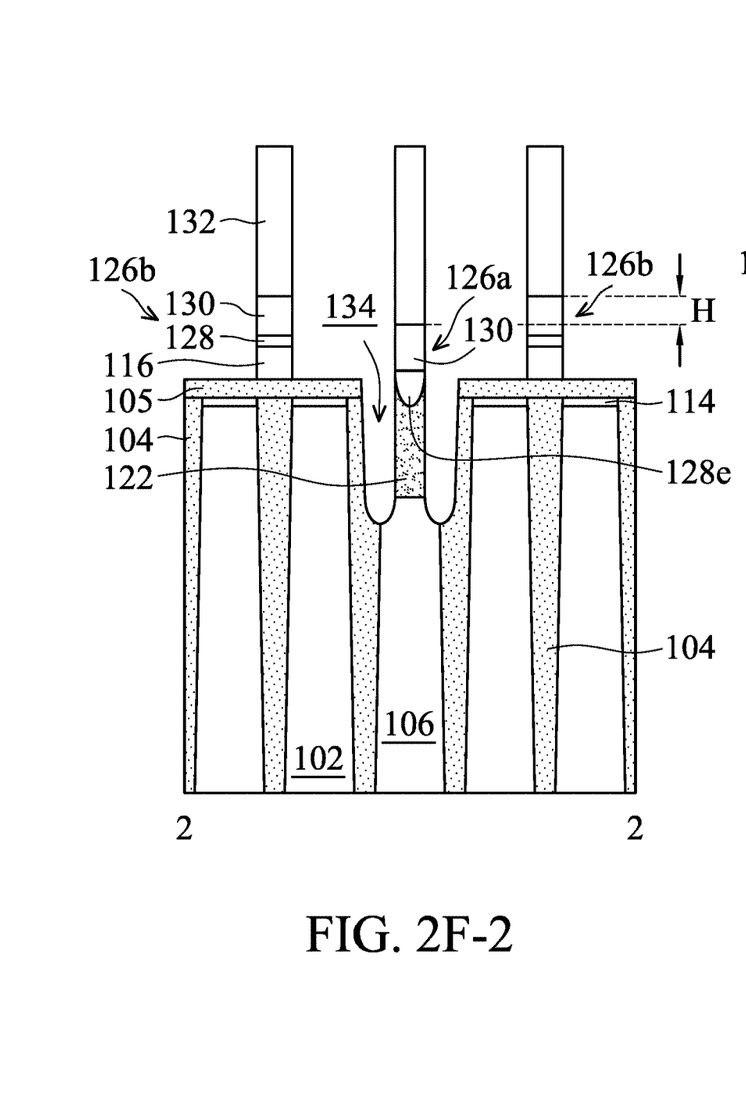
Figure 2G:
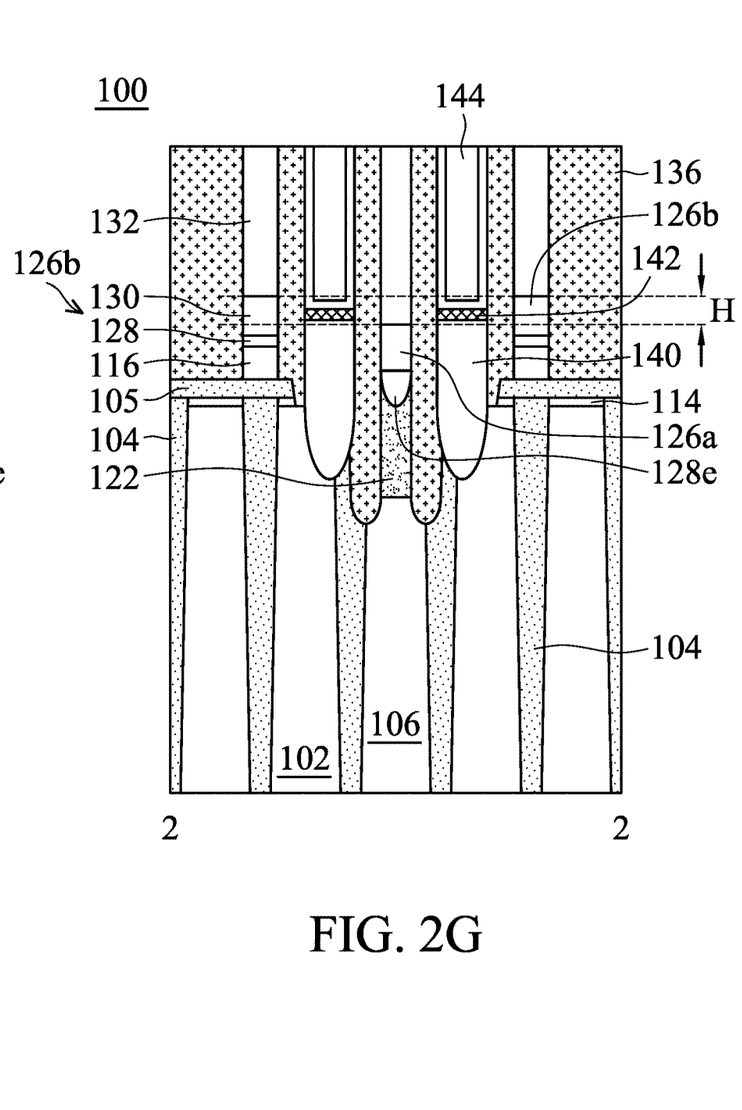

Next, as shown in FIG. 2F-1, a hard mask layer 132 is formed over the bit line material 126. The hard mask layer 132 may include nitrides such as SiN, SiCN, SiOC, SiOCN. The hard mask layer 132 may be a multi-layer structure. The materials of each hard mask layer 132 may be the same or different. Afterwards, as shown in FIG. 2F-2, a first bit line 126a and a second bit line 126b are formed by a patterning process such as a photolithography and an etching process. The first bit line 126a is disposed over the bit line contact 122, and the second bit line 126b is disposed over the isolation structure 104 beside the first bit line 126a.

According to some embodiments, during the process of forming the first bit line 126a, the bit line contact material 122 on opposite sides of the first bit line 126a is removed, and recesses 134 are formed in the substrate 102 on opposite sides of the first bit line 126a. In some embodiments, in order to completely remove the bit line contact material 122, the bottom surface of the recess 134 is lower than the bottom surface of the bit line contact 122.

Since the barrier layer 128 of the first bit line 126a over the bit line contact 122 has the extending portion 128e, the barrier layer 128 of the first bit line 126a is thicker than the barrier layer 128 of the second bit line 126b. In addition, since the conductive layer 130 of the bit line material 126 has a concave top surface over the bit line contact 122, the top surface of the first bit line 126a is lower than the top surface of the second bit line 126b, and the first bit line 126a and the second bit line 126b has a height difference H. In some embodiments, the thicknesses of the conductive layer 130 of the first bit line 126a and the conductive layer 130 of the second bit line 126b are substantially the same.

Next, as shown in FIG. 2G, a spacer structure 136 is conformally formed between and over the bit lines 126a and 126b. The spacer structure 136 may provide isolation of the sidewall of the bit line 126. The isolation structure 136 may be a multi-layer structure. The spacer structure 136 may include oxides, nitrides, other applicable materials, or a combination thereof. In some embodiments, the spacer structure 136 fills the recess 134 to form the isolation structure 136. In some embodiments, the bottom surface of the isolation structure 136 is lower than the bottom surface of the bit line contact 122.

Next, a trench is formed between the bit line 126a and 126b by a patterning process such as a photolithography and an etching process (not shown). A capacitor contact 140 is formed in the trench first. The capacitor contact 140 may include polysilicon material. Next, a silicide 142 is formed over the capacitor contact 140. The silicide 142 may decrease the resistance between the capacitor contact 140 and the subsequently formed capacitor. Next, a capacitor 144 is formed over the silicide 142.

The capacitor 144 may include a bottom electrode, a top electrode, and a dielectric sandwiched between them (not shown). The bottom electrode and the top electrode may include TiN, TaN, TiAlN, TiW, WN, Ti, Au, Ta, Ag, Cu, AlCu, Pt, W, Ru, Al, Ni, metal nitride, or a combination thereof. The dielectric may include high dielectric constant dielectric material such as $HfO_2$, LaO, AlO, ZrO, TiO, $Ta_2O_5$, $Y_2O_3$, $SrTiO_3$, $BaTiO_3$, BaZrO, HfZrO, HfLaO, HfTaO, HfSiO, HfSiON, HfTiO, LaSiO, AlSiO, (Ba, Sr)$TiO_3$, $Al_2O_3$, or a combination thereof.

As described previously, by enlarging the seam 124 of the bit line contact material 122, and filling the barrier layer 128 of the bit line 126 in the enlarged seam, the resistance of the bit line contact 122 may be decreased. In addition, the bit line 126 over the bit line contact 122 is lower, and the bit line contact 122 is also shorter, and the parasitic capacitance between the bit line 126 and the capacitor contact 140 may be decreased.

FIGS. 3A-3C, 3D-1, 3D-2 are cross-sectional representations of various stages of forming a semiconductor memory structure 200 in accordance with some embodiments. Some processes or devices are the same as, or similar to, those described in the embodiments above, and therefore the reference numerals and/or letters may be repeated. For the purpose of brevity, the descriptions of these processes and devices are not repeated herein. The difference from the embodiments described above is that, as shown in FIG. 3A, after etching the bit line contact material 122 and enlarging the seam 124, the bit line material 122 on opposite sides of the seam 124 has a flat top surface.

Figure 3A:
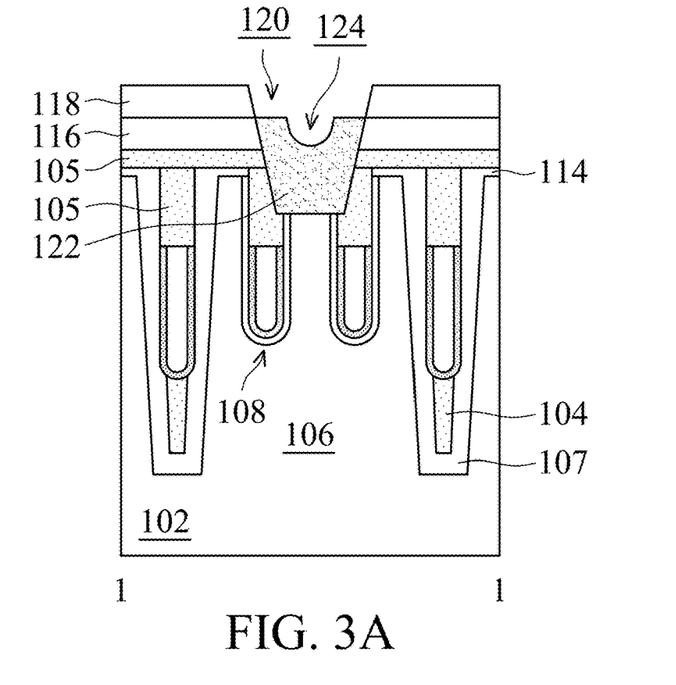

As shown in FIG. 3A, the bit line contact 122 is etched to enlarge the seam 124 and expose the top surface and the sidewalls of the hard mask layer 118. In some embodiments, after etching the bit line contact 122, the top surface of the bit line contact 122 is substantially level with the top surface of the semiconductor material layer 116. Compared to the embodiments shown in FIG. 2C, there is less etching in the embodiments shown in FIG. 3A, and this results in the bit line contact 122 having a flat top surface on opposite sides of the seam 124. In some embodiments, the etching flow of the dry etching is in a range of 20 sccm to 30 sccm.

Figure 3B:
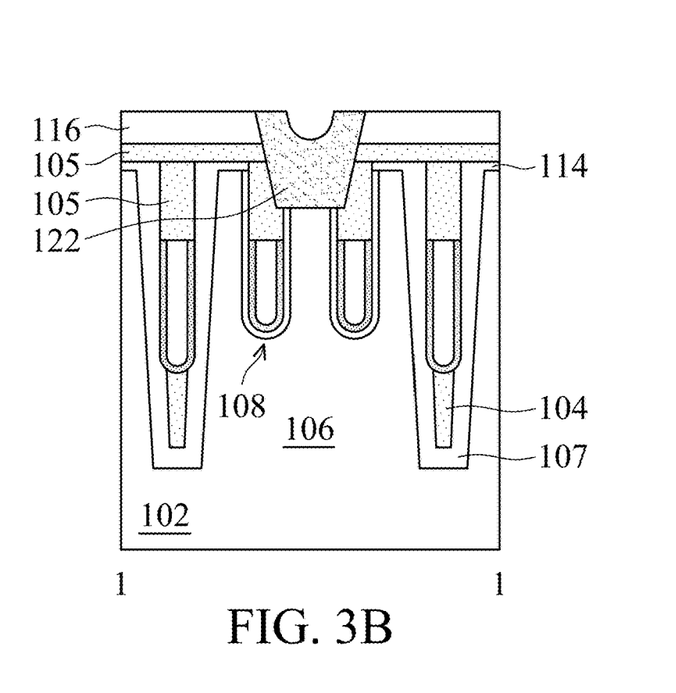

Next, as shown in FIG. 3B, the hard mask layer 118 is removed by an etching process to expose the top surface of the semiconductor material layer 116.

Figure 3C:
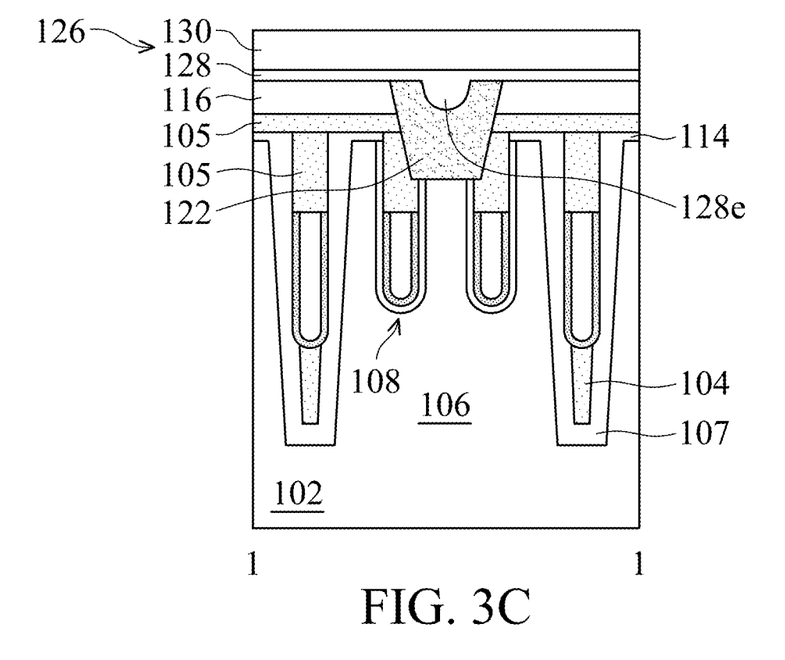

Next, as shown in FIG. 3C, the bit line material 126 is formed in the enlarged seam 124 and the opening 120 and covering over the substrate 102. The bit line material 126 includes the barrier layer 128 and the conductive layer 130. Before forming the conductive layer 130, a barrier layer 128 may be formed in the seam 124. The process and material for forming the bit line material 126 in FIG. 3C are similar or the same as the process and material for forming the bit line material 126 in FIG. 2E, and is not repeated herein.

In some embodiments, since the bit line contact 122 on opposite sides of the seam 124 has a flat top surface, and the barrier layer 128 and the conductive layer 130 of the bit line material 126 are conformally formed over the bit line contact 122, the conductive layer 130 of the bit line material 126 also has a flat top surface over the bit line contact 122.

Figure 3D:
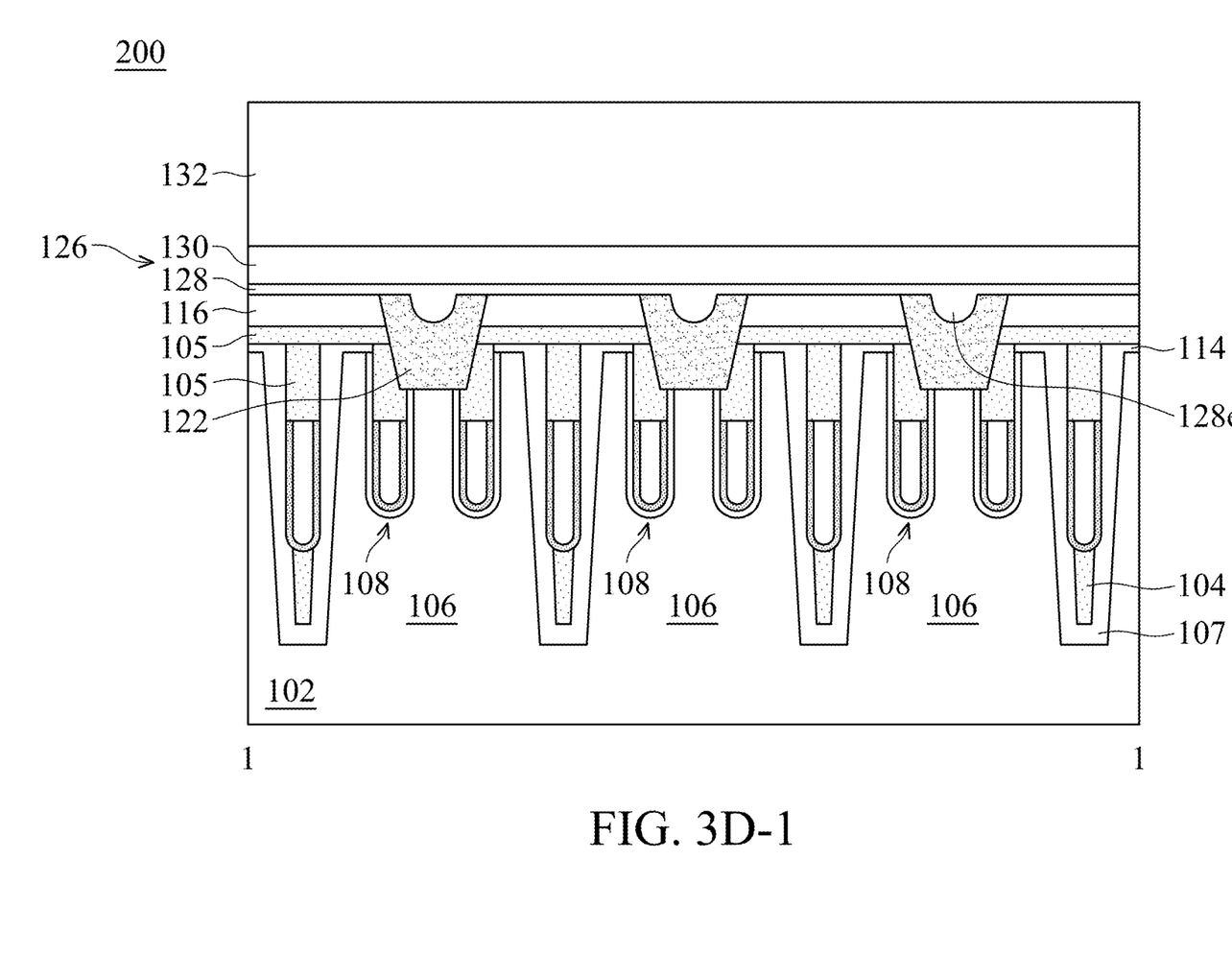

Next, as shown in FIG. 3D-1, a hard mask layer 132 is formed over the bit line material 126. The process and material for forming the hard mask layer 132 in FIG. 3D-1 are similar or the same as the process and material for forming the hard mask layer 132 in FIG. 2F-1, and is not repeated herein.

Figure 3D:
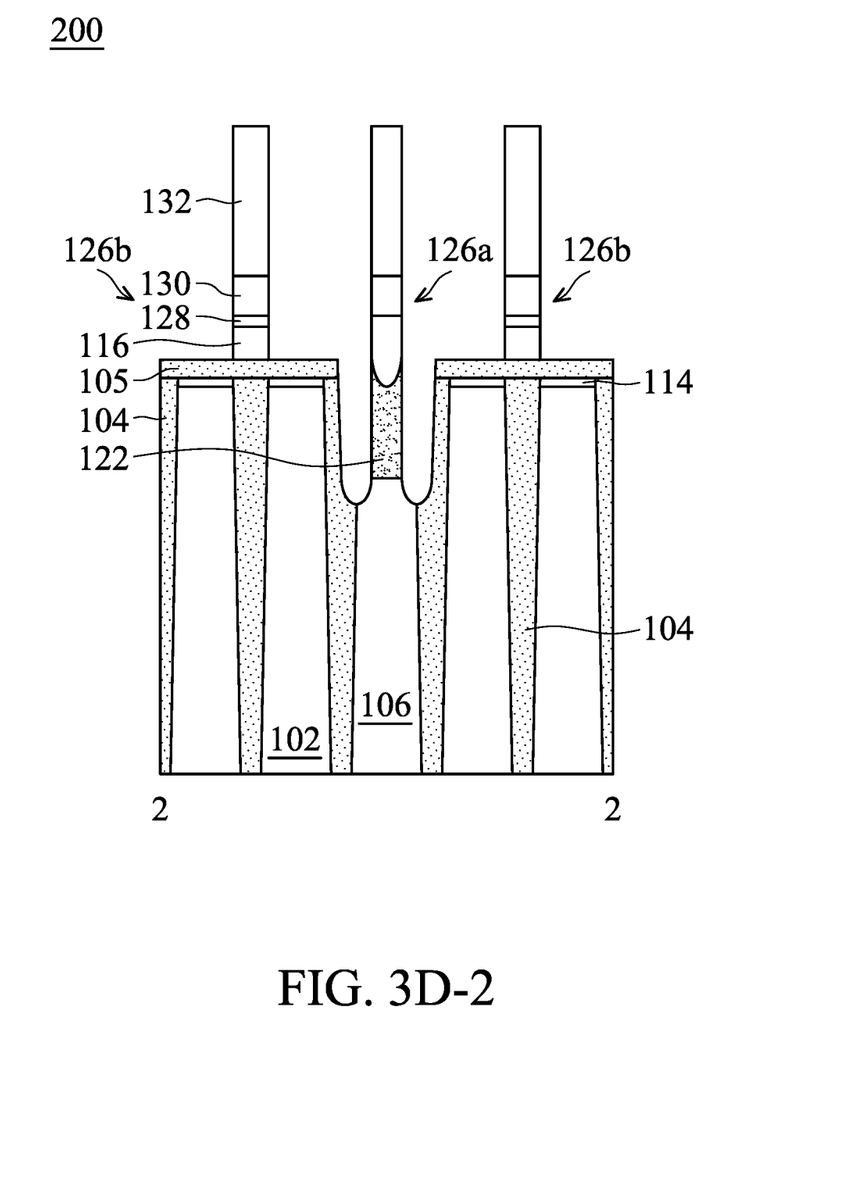

Next, as shown in FIG. 3D-2, the first bit line 126a and the second bit line 126b are formed by a patterning process such as a photolithography and an etching process. The first bit line 126a is disposed over the bit line contact 122, and the second bit line 126b is disposed over the isolation structure 104 beside the first bit line 126a. The process and material for forming the first bit line 126a and the second bit line 126b in FIG. 3D-2 are similar or the same as the process and material for forming the first bit line 126a and the second bit line 126b in FIG. 2F-2, and is not repeated herein.

In some embodiments, the bottom surface of the conductive layer 130 of the first bit line 126a is substantially level with the bottom surface of the conductive layer 130 of the second bit line 126b. The barrier layer 128 of the first bit line 126a is thicker than the barrier layer 128 of the second bit line 126b. Therefore, the resistance may be decreased.

As described previously, by enlarging the seam 124 of the bit line contact material 122, and filling the barrier layer 128 of the bit line 126 in the enlarged seam, the resistance of the bit line contact 122 may be decreased. By controlling the process parameter of etching the bit line contact material 122, the conductive layer 130 of the bit line 126 over the bit line contact material 122 is substantially level with the conductive layer 130 of the bit line 126 over the isolation region 104.

In summary, by enlarging the seam of the bit line contact in an etching process, and filling the barrier layer of the bit line in the seam, the bit line contact resistance may be decreased. In addition, shorter bit line contact and lower bit line both may decrease the parasitic capacitance.

What is claimed is:

1. A semiconductor memory structure, comprising:
    an isolation region surrounding an active region in a substrate;
    two word lines disposed in the active region;
    a bit line contact disposed between two word lines;
    a first bit line disposed over the bit line contact;
    a second bit line disposed over the isolation region beside the first bit line; and
    a capacitor contact disposed between the first bit line and the second bit line,
    wherein the isolation region is disposed between the bit line contact and the capacitor contact, and a bottom surface of the isolation structure is lower than a bottom surface of the bit line contact,
    wherein the bit line contact comprises polysilicon and has a concave top surface.

2. The semiconductor memory structure as claimed in claim 1, wherein a top surface of the first bit line is lower than a top surface of the second bit line.

3. The semiconductor memory structure as claimed in claim 1, wherein the first bit line and the second bit line each comprises a barrier layer and a conductive layer, wherein the barrier layer of the first bit line is thicker than the barrier layer of the second bit line.

4. The semiconductor memory structure as claimed in claim 3, wherein a bottom surface of the conductive layer of the second bit line is substantially level with a bottom surface of the conductive layer of the first bit line.

5. The semiconductor memory structure as claimed in claim 3, wherein a thickness of the conductive layer of the first bit line and a thickness of the conductive layer of the second bit line are substantially the same.

6. A semiconductor memory structure, comprising:
a bit line contact disposed over an active region between two word lines;
a first bit line, comprising a first barrier layer and a first conductive layer, disposed over the bit line contact;
a second bit line, comprising a second barrier layer and a second conductive layer, disposed over an isolation region;
a capacitor contact disposed between the first bit line and the second bit line; and
an isolation structure disposed between the bit line contact and the capacitor contact,
wherein a bottom surface of the isolation structure is lower than a bottom surface of the bit line contact,
wherein the first barrier layer is thicker than the second barrier layer.

7. The semiconductor memory structure as claimed in claim 6, wherein the first bit line has a concave top surface over the bit line contact.

8. The semiconductor memory structure as claimed in claim 6, further comprising:
a hard mask layer disposed over the first bit line and the second bit line,
wherein the hard mask layer is a multi-layer structure.

9. The semiconductor memory structure as claimed in claim 6, wherein the first barrier layer has an extending portion extending in the bit line contact, wherein the extending portion is narrower than the bit line contact.

10. The semiconductor memory structure as claimed in claim 9, wherein a top surface of the extending portion is wider than a bottom surface of the extending portion.

11. The semiconductor memory structure as claimed in claim 6, further comprising:
a capacitor disposed over the capacitor contact.

12. A method for forming a semiconductor memory structure, comprising:
forming an isolation structure surrounding an active region in a substrate;
forming two word lines in the active region;
forming an opening between the two word lines;
depositing a polysilicon layer having a seam in the opening;
etching the polysilicon layer to enlarge the seam to form a bit line contact in the opening;
depositing a bit line material in the seam to form a first bit line;
forming a second bit line over the isolation structure beside the first bit line; and
forming a capacitor contact between the first bit line and the second bit line,
wherein the isolation structure is between the bit line contact and the capacitor contact,
wherein a bottom surface of the isolation structure is lower than a bottom surface of the bit line contact.

13. The method for forming a semiconductor memory structure as claimed in claim 12, wherein after etching the polysilicon layer, the polysilicon layer has a curved top surface.

14. The method for forming a semiconductor memory structure as claimed in claim 12, further comprising:
depositing a first hard mask layer over the substrate;
forming an opening in the first hard mask layer;
conformally depositing the polysilicon layer in the opening and over the first hard mask layer; and
removing the first hard mask layer after enlarging the seam.

15. The method for forming a semiconductor memory structure as claimed in claim 14, wherein after etching the polysilicon layer, a top surface and a sidewall of the first hard mask layer is exposed.

16. The method for forming a semiconductor memory structure as claimed in claim 14, further comprising:
forming a second hard mask layer over the bit line material,
wherein the first hard mask layer and the second hard mask layer are made of different materials.

17. The method for forming a semiconductor memory structure as claimed in claim 12, further comprising:
depositing an isolation layer over the active region;
depositing a semiconductor material layer over the isolation layer,
wherein after enlarging the seam, a highest point of the polysilicon layer is substantially level with a top surface of the semiconductor material layer.

18. The method for forming a semiconductor memory structure as claimed in claim 12, wherein after etching the polysilicon layer, the polysilicon layer on opposite sides of the seam has a flat top surface.

* * * * *